(12) United States Patent
O'Donncha et al.

(10) Patent No.: US 10,929,578 B2
(45) Date of Patent: *Feb. 23, 2021

(54) MINIMIZING UNCERTAINTY ENVELOPES IN TRAJECTORIES OF EVOLVING ENSEMBLE MEMBERS

(71) Applicant: International Business Machines Corporation, Armonk, NY (US)

(72) Inventors: Fearghal O'Donncha, Galway (IE); Emanuele Ragnoli, Dublin (IE); Frank Suits, Garrison, NY (US); Sergiy Zhuk, Dublin (IE)

(73) Assignee: International Business Machines Corporation, Armonk, NY (US)

( * ) Notice: Subject to any disclaimer, the term of this patent is extended or adjusted under 35 U.S.C. 154(b) by 499 days.

This patent is subject to a terminal disclaimer.

(21) Appl. No.: 15/853,192

(22) Filed: Dec. 22, 2017

(65) Prior Publication Data

US 2018/0137222 A1    May 17, 2018

Related U.S. Application Data

(63) Continuation of application No. 14/259,466, filed on Apr. 23, 2014, now Pat. No. 9,881,105.

(51) Int. Cl.
*G06F 30/20* (2020.01)
*G06F 17/18* (2006.01)

(52) U.S. Cl.
CPC .............. *G06F 30/20* (2020.01); *G06F 17/18* (2013.01)

(58) Field of Classification Search
CPC .................................. G06F 30/20; G06F 17/18
See application file for complete search history.

(56) References Cited

U.S. PATENT DOCUMENTS 5,263,120 A    11/1993  Bickel
7,467,116 B2  12/2008  Wang
(Continued)

OTHER PUBLICATIONS

Milanese, Mario et al., "Optimal Algorithms Theory for Robust Estimation and Prediction", IEEE Transactions on Automatic Control, vol. 30, No. 8, Aug. 1985, pp. 730-738.
(Continued)

*Primary Examiner* — Rehana Perveen
*Assistant Examiner* — Steven W Crabb
(74) *Attorney, Agent, or Firm* — Stephen R. Tkacs; Stephen J. Walder, Jr.; Kurt P. Goudy

(57) ABSTRACT

A mechanism is provided in a data processing system for minimizing uncertainty envelopes in trajectories of evolving ensemble members. The mechanism generates a trajectory forecast of each member object of an ensemble based on an initial state-space and a model for predicting trajectories of the member objects to generate a plurality of trajectory forecasts. Each of the plurality of trajectory forecasts has an individual uncertainty envelope. The mechanism applies a classification algorithm on the plurality of trajectory forecasts to identify at least one group of member objects having similar trajectory forecasts, generates a reduced ensemble of member objects including the identified group of member objects, and reconfigures the state-space and the model for predicting trajectories. The mechanism generates an updated trajectory forecast of each member object of the reduced ensemble based on the reconfigured state-space and the reconfigured model for predicting trajectories of the member objects.

20 Claims, 4 Drawing Sheets

(56) References Cited

U.S. PATENT DOCUMENTS

| | | |
|---|---|---|
| 8,006,220 B2 | 8/2011 | McConaghy et al. |
| 2003/0065535 A1 | 4/2003 | Karlov et al. |
| 2004/0143396 A1 | 7/2004 | Allen et al. |
| 2007/0118346 A1* | 5/2007 | Wen ........................ E21B 43/00 703/10 |
| 2009/0083680 A1 | 3/2009 | McConaghy et al. |
| 2012/0232865 A1 | 9/2012 | Maucec et al. |
| 2014/0074766 A1* | 3/2014 | Aristoff .................... G06N 5/02 706/52 |
| 2014/0136165 A1* | 5/2014 | Sarma .................. G06Q 10/067 703/2 |

OTHER PUBLICATIONS

List of IBM Patents or Patent Applications Treated as Related, Dec. 22, 2017, 2 pages.

Mallet, Vivien et al., "Minimax filtering for sequential aggregation: Application to ensemble forecast of ozone analyses", American Geophysical Union, Journal of Geophysical Research: Atmospheres, vol. 118, Oct. 2, 2013, pp. 11,294-11,303.

\* cited by examiner

MINIMIZING UNCERTAINTY ENVELOPES IN TRAJECTORIES OF EVOLVING ENSEMBLE MEMBERS

BACKGROUND

The present application relates generally to an improved data processing apparatus and method and more specifically to mechanisms for minimizing uncertainty envelopes in trajectories of evolving ensemble members.

In many problems such as parameter and state estimation for dynamical systems, time series prediction, and functions approximation, one must estimate some unknown variable using available data. The data are always associated with some uncertainty, and it is necessary to evaluate how this uncertainty affects the estimated variables.

Many industries have applications in which it is important to predict the behavior of an ensemble of objects over time. For example, one may be attempting to predict the failure time of a device, health impact on a patient, failure to meet design specifications, diffusion of pollutant particles etc. In such applications, one studies the state of the ensemble of objects over time by employing a model. One studies the model in an abstract space (i.e., the state space) that contains trajectories of the members of the ensemble.

Since the future values of parameters of the objects are uncertain, analysis of the states of the ensemble includes enclosing the trajectories in uncertainty envelopes. Predicting the maximum extent of the uncertainty envelopes over time is important in order to know critical values for the applications.

Algorithms have been developed to predict the maximum envelope in state space that encompasses such an ensemble under an assumed model for the starting state of the ensemble and in the presence of noise and uncertainty. The minimax approach is one of many classical ways to pose a state estimation problem. More details on the minimax framework, set-membership uncertainty estimation and reachability analysis can be found in the following references: M. Milanese and R. Tempo, "Optimal algorithms theory for robust estimation and prediction," IEEE Trans. Automat. Control, vol. 30, no. 8, pp. 730-738, 1985; F. L. Chernousko, State Estimation for Dynamic Systems. Boca Raton, Fla.: CRC, 1994; A. Nakonechny, "A minimax estimate for functionals of the solutions of operator equations," Arch. Math. (Brno), vol. 14, no. 1, pp. 55-59, 1978; and, A. Kurzhanski and I. Vályi, Ellipsoidal calculus for estimation and control, ser. Systems & Control: Foundations & Applications. Boston, Mass.: Birkhaüser Boston Inc., 1997.

SUMMARY

In one illustrative embodiment, a method, in a data processing system, is provided for minimizing uncertainty envelopes in trajectories of evolving ensemble members. The method comprises generating a trajectory forecast of each member object of an ensemble based on an initial state-space and a model for predicting trajectories of the member objects to generate a plurality of trajectory forecasts. Each of the plurality of trajectory forecasts has an individual uncertainty envelope. The ensemble has an ensemble uncertainty envelope. The method further comprises applying a classification algorithm on the plurality of trajectory forecasts to identify at least one group of member objects having similar trajectory forecasts. The method further comprises generating a reduced ensemble of member objects including the identified group of member objects. The method further comprises reconfiguring the state-space and the model for predicting trajectories. The method further comprises generating an updated trajectory forecast of each member object of the reduced ensemble based on the reconfigured state-space and the reconfigured model for predicting trajectories of the member objects.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
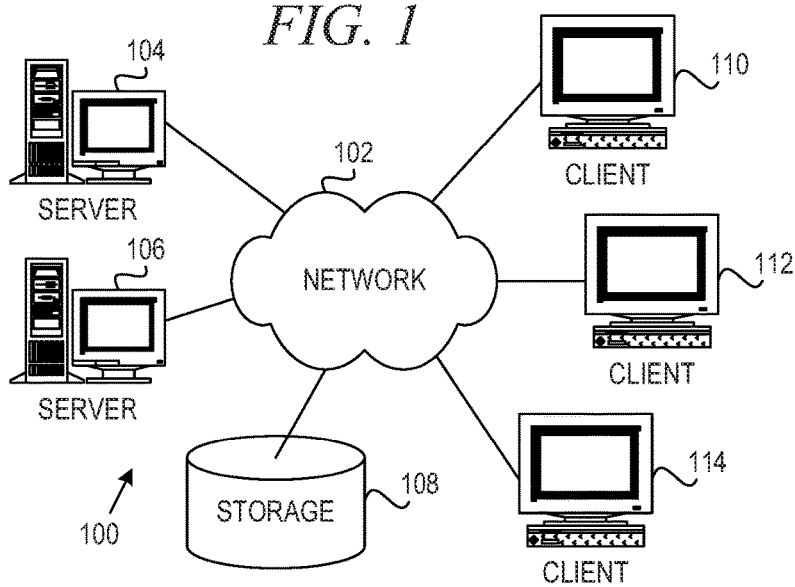
FIG. 1 depicts a pictorial representation of an example distributed data processing system in which aspects of the illustrative embodiments may be implemented.

The illustrative embodiments provide a mechanism for minimizing uncertainty envelopes in trajectories of evolving ensemble members, while periodically classifying and refining their trajectories. An ensemble contains ensemble members that have intrinsic parameters. The members exist in an N-dimensional state space and a model uses the intrinsic parameters of a member to predict its trajectory in the state space. An ensemble member has measurable properties that serve as state variables to define its location in N-dimensional state space at any given time. The sequence of locations of an ensemble member in state space over time defines its trajectory in the state space. Ensemble members have intrinsic parameters that determine their changes in location from one time to another in the state space.

A model predicts the future location of an ensemble member given its current state variables and its intrinsic parameters. The trajectories in state space evolve according to the model, but the exact values of the ensemble parameters are not known, nor is the distribution of those values in the parameter space covered by the ensemble. There is uncertainty in the model, uncertainty in the measurements, and uncertainty in the assumed values of the member parameters.

Many applications need to predict the overall envelope that encloses all the trajectories of the ensemble over time. Many applications involve an ensemble whose members belong to distinct classes with similar intrinsic parameters. If the ensemble is in a small area of state space initially, the trajectories that evolve from those initial conditions will themselves show common behavior due to the distinct sub-classes of the ensemble. Although the sub-classes are not known at the outset, they can be deduced from the common behavior of sub-groups of the trajectories when observed at different time points.

There are existing methods to estimate the overall envelope of an ensemble given a model and an ensemble with known intrinsic parameters. This invention relies on clustering the trajectories to discover sub-classes within the ensemble. Once the sub-classes are known, the overall envelope of the trajectories can be predicted with greater accuracy. Over time, trajectories of objects in an ensemble might cluster together into subgroups that show common behavior. Combining a classification of the subgroups with the subgroup uncertainty envelope allows targeted corrections or changes and improved forecasts. Identification of the subgroup uncertainty envelopes and their union potentially creates a much smaller overall envelope that allows for better and easier monitoring, control, and prediction.

The mechanism of the illustrative embodiments takes into account uncertainties in forecasted trajectories of a model and uncertainties in the ensemble of parameters that characterize the model. A mechanism computes the envelope of the trajectories. At periodic evolution steps, the mechanism classifies the trajectories based on similar behavior in the state space and recomputes the envelopes with a reduced total area in the state space representing a more refined forecast. The illustrative embodiments allow targeted modification of trajectories based on the sub-classification.

A "mechanism," as used herein, may be an implementation of the functions or aspects of the illustrative embodiments in the form of an apparatus, a procedure, or a computer program product. The mechanisms described herein may be implemented as specialized hardware, software executing on general purpose hardware, software instructions stored on a medium such that the instructions are readily executable by specialized or general purpose hardware, a procedure or method for executing the functions, or a combination of the above.

Figure 2:
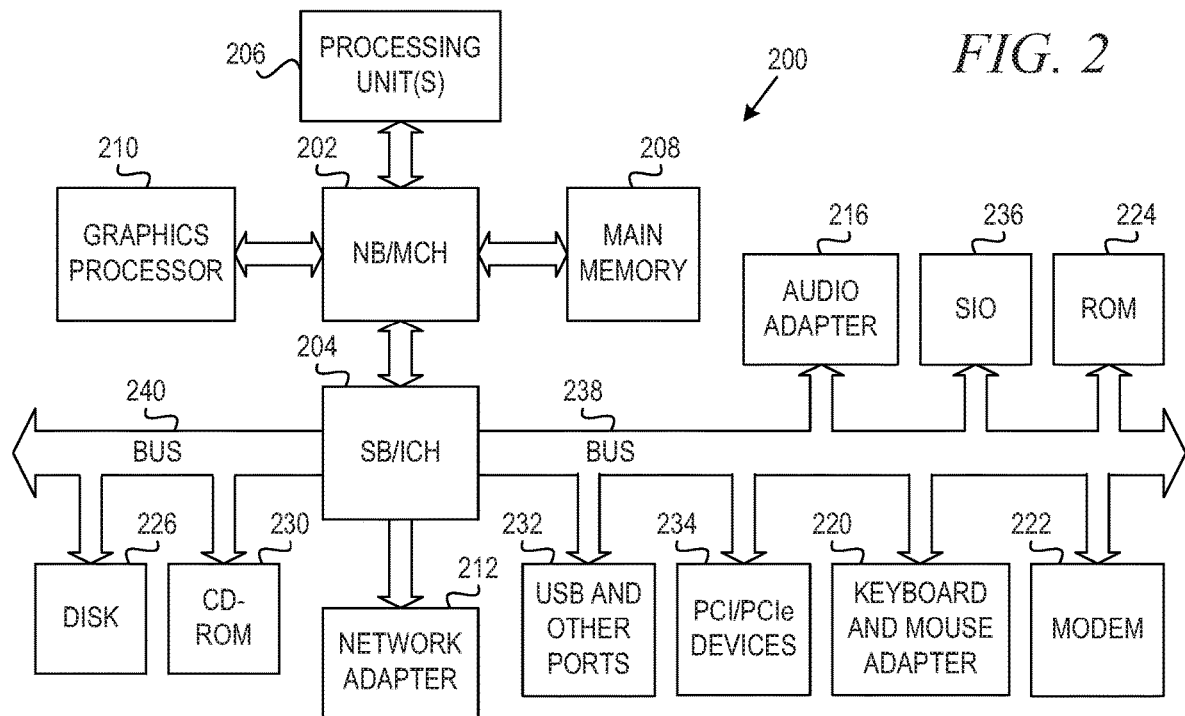
FIG. 2 is a block diagram of an example data processing system in which aspects of the illustrative embodiments may be implemented.

The illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System P® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

The illustrative embodiments provide a system for simulating an ensemble of member objects using a model. The system analyzes the evolution of the measured states of the ensemble members and their trajectories over time in the state space. The system tracks and predicts the uncertainty envelope that encompasses the ensemble members over time. At periodic time steps, the system groups trajectories using clustering or similar classification techniques. The system computes uncertainty envelopes for the subgroup of ensemble objects and monitors and predicts these members over a number of time steps. The system also monitors the union of the subgroup of uncertainty envelopes, resulting in a much smaller overall envelope to monitor.

For example, in a clinical trial for a test drug, a set of patients may be given the drug at the start, and their biological parameters are studied over time. The state space is then the set of biological parameters monitored, and the defining parameters for the ensemble are properties such as gender, age, weight, etc. Initially, if nothing is known about the particular side effects of the drug, all patients are assumed to behave similarly over time. However, if some of the trajectories indicate a subgroup that responds to the drug in a similar, common way, then that subgroup can be identified and given a corrective treatment that is expected to result in behavior that is even more similar within the subgroup. After this corrective treatment, the new expected trajectories can be calculated.

As another example, the manufacturing of a new device may involve a staged process starting from initial components and leading to the final product, with testing along the way to make sure each device is within prescribed tolerance levels to realize the desired specifications in the end product. Each assembly run may show different spread in test measurements during assembly that may indicate components from a particular batch are showing a different statistical spread in test results. Those components can be identified through trajectory sub-classing and corrected with new components, allowing new predictions of product yield in the end result, based on the predicted spread of specification parameters in the final product after assembly.

In a further example, the tracking and forecasting of different chemical species in a fluid is done by simulations with a model described by advection-diffusion-reaction equations. Each chemical species has an associated reaction mechanism that is described by a set of parameters in the underlying model. Clustering a set of parameters and computing the associated trajectory envelopes allows a better monitoring and forecasting of the associated chemical species.

Figure 3:
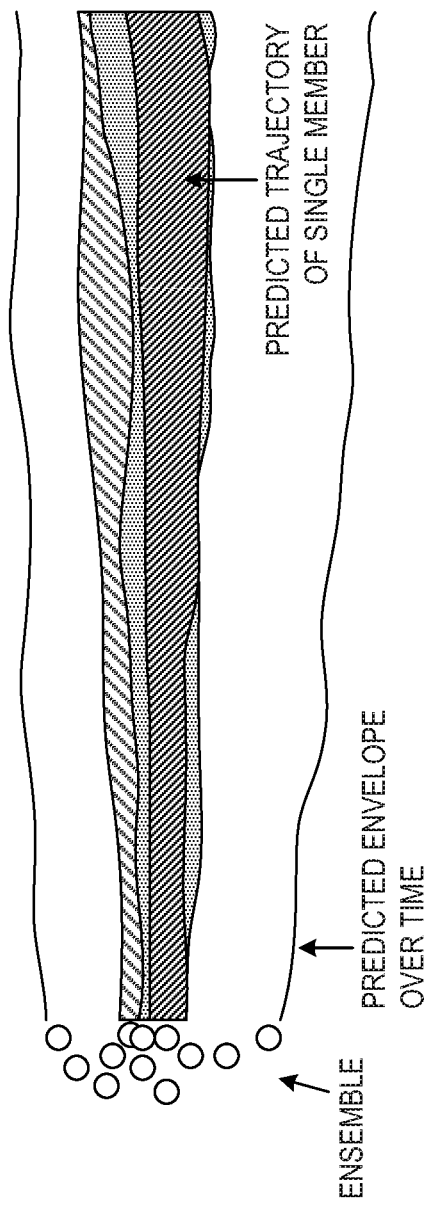
FIG. 3 illustrates an example uncertainty envelope for an ensemble of objects in accordance with an illustrative embodiment.

FIG. 3 illustrates an example uncertainty envelope for an ensemble of objects in accordance with an illustrative embodiment. The ensemble comprises member objects and their trajectories in state space. Each member has a predicted trajectory with an uncertainty envelope. The ensemble itself has a larger uncertainty envelope that is the range of all possible values for the parameters of the objects in the ensemble. The system computes the single envelope of the ensemble. The system may use the minimax technique to compute the envelope of the ensemble.

Figure 4A:
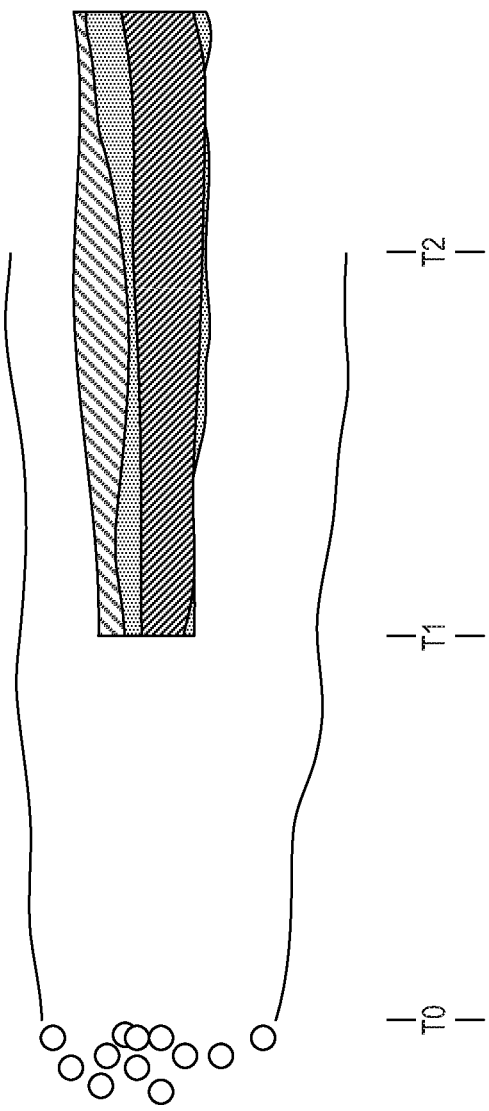
FIGS. 4A and 4B illustrate an example of minimizing uncertainty envelopes in trajectories of evolving ensemble members in accordance with an illustrative embodiment.
Figure 4B:
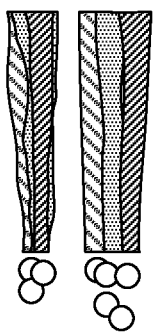

FIGS. 4A and 4B illustrate an example of minimizing uncertainty envelopes in trajectories of evolving ensemble members in accordance with an illustrative embodiment. As shown in FIG. 4A, the system measures the state of ensemble members and predicts trajectories of the ensemble at time T0.

Then, at time T1, the system measures the ensemble members in state-space as they evolve and predict trajectories of the ensemble. Also, at time T1, the system identifies a cluster of ensemble members having similar trajectories. The system then predicts new uncertainty envelopes for the cluster. The system may identify a plurality of such cluster and associate each ensemble member with a cluster—if by that time the trajectories reveal sub-groups of ensemble members with common trajectory behavior.

As shown in FIG. 4B, at time T2, the system treats the cluster, or subgroup, as a new ensemble. Thus, at time T2, the system measures the members of the new cluster in state-space and predicts the trajectories of the new ensemble. As can be seen, the envelope for the original ensemble shown in FIG. 4A is much larger than the envelope for the cluster shown in FIG. 4B. The reduction in size of the envelope is due both to the refined prediction of the ensemble and the detection of any non-overlapping sub-groups of trajectories. If the overall envelope consists of distinct sub-envelopes, the area of state space occupied at a given time is less than that of the overall envelope that encompasses all members.

The actual trajectories measured at time T2 are different from the previous predictions at times T0 and T1 and allow new updated and more accurate future predictions. If the ensemble shows cluster behavior, that will become evident in future time points and will allow a refined prediction based on the common behavior, which will show in the trajectories as distinct regions of state space.

In one example embodiment, one may reconfigure the parameters of the new ensemble to attempt to keep the trajectories similar. One example of this application is a corrective measure taken on an assembly line to prevent a device from being manufactured out of spec. If a batch of components results in a tendency for devices to stray from optimal parameters at a stage of assembly, then can be selectively given corrective treatment to keep them from going out of specifications at a later stage. Another example is in a clinical trial of a drug, where during the trial a sub-group of patients exhibits side-effects due to a common genetic predilection. Those patients can be identified and given an adjustment to their treatment to help direct their health trajectories toward the desired outcome.

Figure 5:
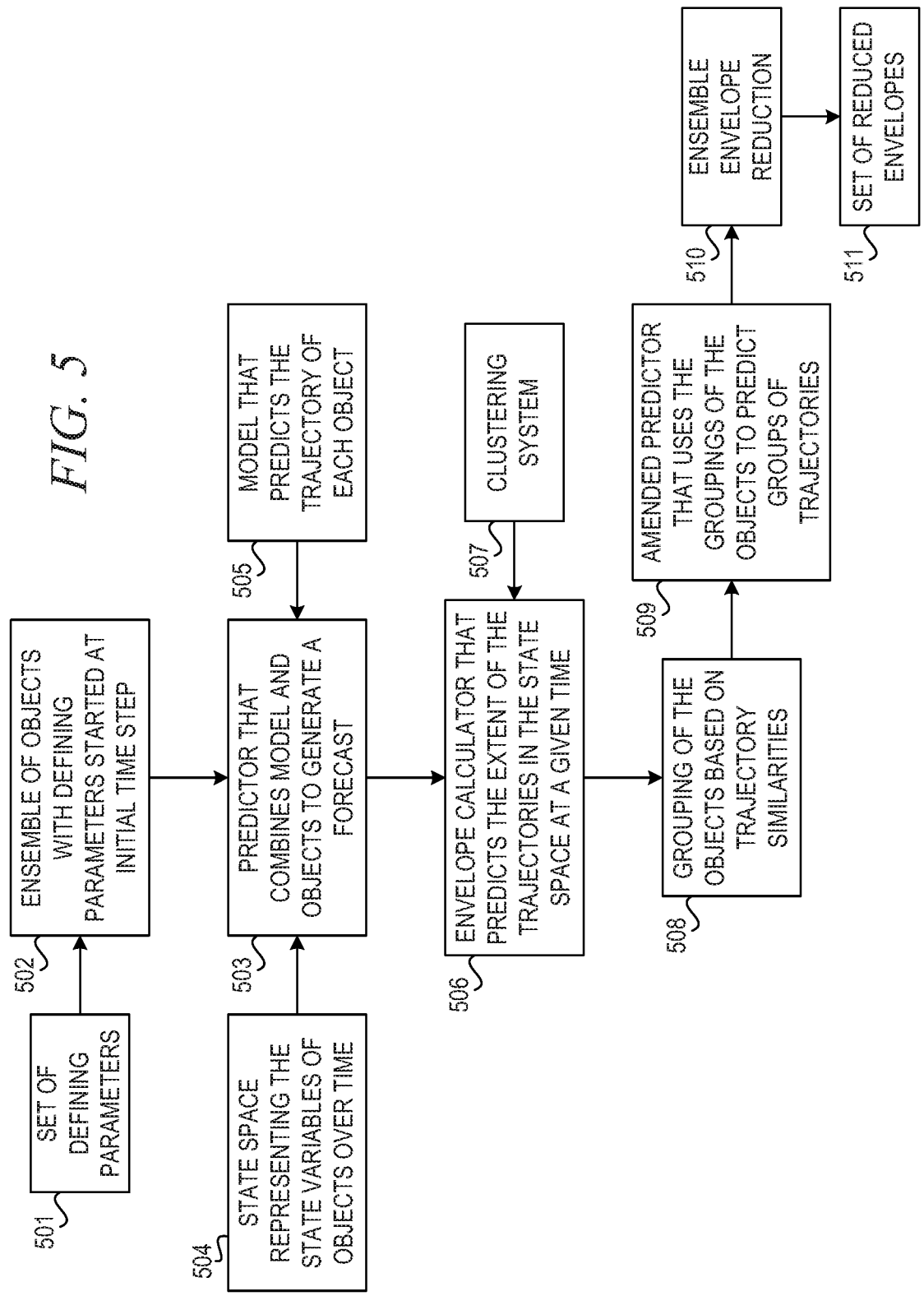
FIG. 5 is a block diagram illustrating system components for minimizing uncertainty envelopes in trajectories of evolving ensemble members in accordance with an illustrative embodiment.

FIG. 5 is a block diagram illustrating system components for minimizing uncertainty envelopes in trajectories of evolving ensemble members in accordance with an illustrative embodiment. At block 501, an administrator generates a set of defining parameters for selecting member objects of the ensemble. At block 502, the ensemble of objects with the defining parameters is started at an initial time step.

Block 503 represents a predictor that combines the state-space representing the state variables of the objects over time (block 504) and a model that predicts the trajectory of each object (block 505) to generate a forecast. With a large ensemble of objects based on the set of defining parameters in block 501 and uncertainty in the state-space in block 504 and the model in block 505, the uncertainty envelope of the forecast for the envelope generated in block 503 may be quite large.

Block 506 represents an envelope calculator that predicts the extent of the trajectories in the state-space at a given time. The envelope calculator in block 506 receives input form the clustering system at block 507. The envelope calculator uses a clustering algorithm to generate a grouping of the objects based on trajectory similarities (block 508).

In one example embodiment, the clustering algorithm is a k-means clustering algorithm, which is a method of vector quantization originally from signal processing that is popular for cluster analysis in data mining. The k-means clustering algorithm aims to partition n observations into k clusters in which each observation belongs to the cluster with the nearest mean, serving as a prototype of the cluster.

Given a set of observations $(x_1, x_2, \ldots, x_n)$, where each observation is a d-dimensional real vector (which, in this case is derived from the magnitude of the diffraction orders in the Fourier transform of the pattern), k-means clustering aims to partition the n observations into k sets $(k \le n)$ $S = \{S_1, S_2, \ldots, S_k\}$ so as to minimize the within-cluster sum of squares (WCSS):

$$\underset{S}{\mathrm{argmin}} \sum_{i=1}^{k} \sum_{x_j \in S_i} \|x_j - \mu_i\|^2,$$

where $\mu_i$ is the mean of points in $S_i$.

The most common algorithm uses an iterative refinement technique. Due to its ubiquity, this algorithm is often called the k-means algorithm; it is also referred to as Lloyds algorithm, particularly in the computer science community. Of course, other variations of the k-means clustering algorithm may be used in the illustrative embodiment. Given an initial set of k means $m_1^{(1)}, \ldots, m_k^{(1)}$, which are usually randomly assigned, the algorithm proceeds by alternating between two steps:

Assignment steps: Assign each observation to the cluster whose mean yields the least within-cluster sum of squares (WCSS). Since the sum of squares is the squared Euclidean distance, this is intuitively the "nearest" mean.

$$S_i^{(t)} = \{x_p : \|x_p - m_i^{(t)}\|^2 \le \|x_p - m_j^{(t)}\|^2 \, \forall 1 \le j \le k\},$$

where each $x_p$ is assigned to exactly one $S^{(t)}$, even if it could be is assigned to two or more of them.

Update step: Calculate the new means to be the centroids of the observations in the new clusters.

$$m_i^{(t+1)} = \frac{1}{|S_i^{(t)}|} \sum_{x_j \in S_i^{(t)}} x_j$$

Since the arithmetic mean is a least-squares estimator, this also minimizes the within-cluster sum of squares (WCSS) objective.

The algorithm converges when the assignments no longer change. Since both steps optimize the objective, and there only exist a finite number of such partitions, the algorithm must converge to a (local) optimum. There is no guarantee that the global optimum is found using this algorithm.

The algorithm is often presented as assigning objects to the nearest cluster by distance. This is slightly inaccurate: the algorithm aims at minimizing the WCSS objective, and thus assigns by "least sum of squares." Using a different distance function other than (squared) Euclidean distance may stop the algorithm from converging. It is correct that the smallest Euclidean distance yields the smallest squared Euclidean distance and thus also yields the smallest sum of squares. Various modifications of k-means such as spherical k-means and k-medoids have been proposed to allow using other distance measures.

Commonly used initialization methods are Forgy and Random Partition. The Forgy method randomly chooses k observations from the data set and uses these as the initial means. The Random Partition method first randomly assigns a cluster to each observation and then proceeds to the update step, thus computing the initial mean to be the centroid of the cluster's randomly assigned points. The Forgy method tends to spread the initial means out, while Random Partition places all of them close to the center of the data set.

As the k-means algorithm is a heuristic algorithm, there is no guarantee that it will converge to the global optimum, and the result may depend on the initial clusters. As the algorithm is usually very fast, it is common to run it multiple times with different starting conditions.

Thus, in the illustrative embodiment, given n ORC layouts and k clusters to determine from the layouts, the mechanism considers the optimization problem to minimize the distance of clips to each of k centroids, which is as follows:

$$\text{argmin} \sum_{i=1}^{k} \sum_{x_j \in S_i} \|x_j - \mu_i\|^2$$

$S = \{S_1, S_2, \ldots S_k\}$ represents the set of clusters into which we wish to partition the clips. Each sample $x_j = \{x_j^{(1)}, x_j^{(2)}, \ldots, x_j^{(m)}\}$ is an m-dimensional vector derived from the frequency domain representation of pattern j. The centroid of each cluster i, derived from the average, is represented by $\mu_i$. While the embodiment described above uses k-means clustering, other sophisticated clustering algorithms may also be used within the spirit and scope of the present invention. Alternatively, other classification techniques may also be used within the scope of illustrative embodiments.

Based on the grouping in block 508, the system generates an amended predictor that uses the groupings of the objects to predict groups of trajectories at block 509. An administrator may reconfigure the model in block 505 to be specific to the subgroup of member objects. In one embodiment, the administrator may reconfigure the state-space in block 504 to tailor the conditions for the subgroup of member objects. For instance, the administrator may give a corrective treatment to a subset of patients to influence the forecast envelopes for the subgroup. In another example, the administrator may correct a subset of components in devices being tested.

Grouping the member objects in block 508 and amending the model in block 509 results in ensemble envelope reduction in block 510. The system then generates a set of reduced envelopes in block 511. These reduced envelopes result in the uncertainty envelope for the reduced ensemble may be substantially smaller than the original envelope for the forecast generated in block 503. This allows targeted corrections to the subgroup based on their envelopes. A much smaller overall envelope allows better prediction and monitoring. An overall smaller envelope and targeted subgroup envelopes allow for better prediction and monitoring if critical parameters of the application involved.

Once the subgroups of trajectories have been identified, the minimax estimate function can be applied to each of the subgroups to predict their individual envelopes. If the trajectories are distinct enough to separate in state space, which is expected if they are to cluster separately in the first place, their envelopes will separate and the net area of state space occupied by the individual envelopes will be less than that of the overall envelope encompassing all trajectories.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
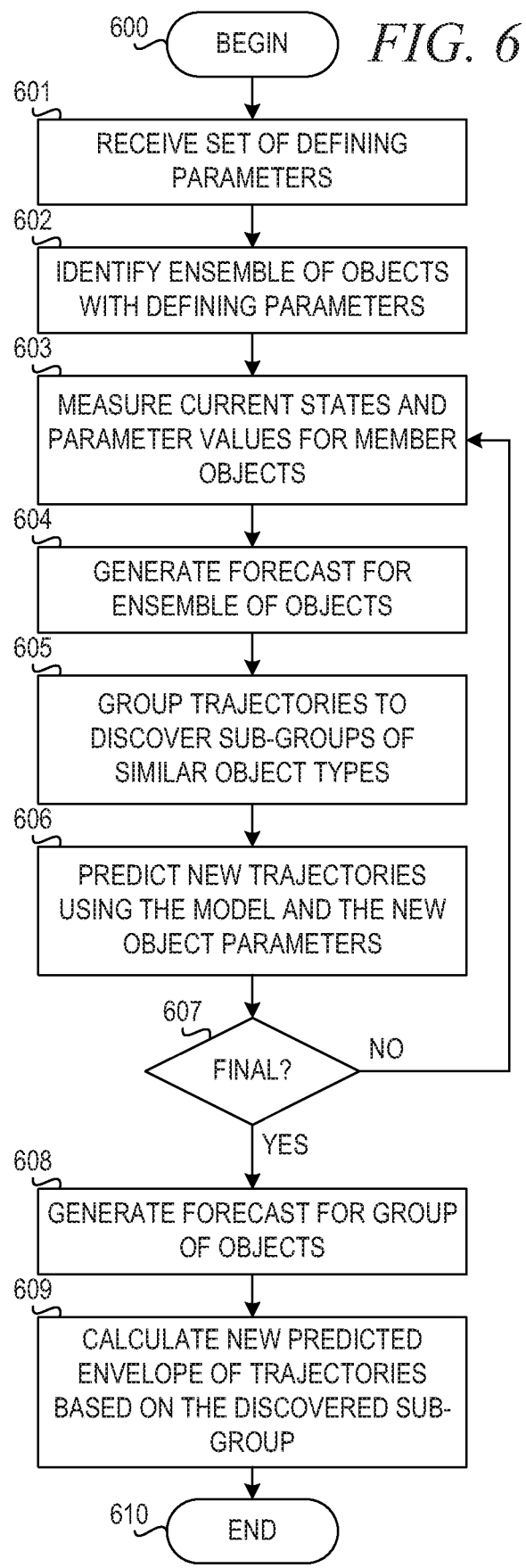
FIG. 6 is a flowchart of operation of a system for minimizing uncertainty envelopes in trajectories of evolving ensemble members in accordance with an illustrative embodiment.

FIG. 6 is a flowchart of operation of a system for minimizing uncertainty envelopes in trajectories of evolving ensemble members in accordance with an illustrative embodiment. Operation begins (block 600), and the system receives a set of defining parameters for selecting member objects of the ensemble (block 601). The system then identifies an ensemble of objects with the defining parameters (block 602). The system measures current states and parameter values for the member objects (i.e., the state-space) (block 603) and generates a forecast for the ensemble of objects using a model that predicts the trajectory of each object (block 604).

Then, the system groups similar trajectories to discover sub-groups of similar object types within the ensemble (block 605). The system may group objects using a known classification technique. In one example embodiment, the system uses k-means clustering to group objects having similar trajectories. The system then predicts new trajectories using the model and the new object parameters (block 606).

The system then determines whether the group of objects is the final group (block 607). The system may determine that the group is the final group if the trajectories converge such that the trajectories are within a predetermined range of each other. Alternatively, the system may determine the group is the final group after a predetermined number of iterations or a predetermined amount of time. On the other hand, the system may continue to refine the groupings of member objects indefinitely to continuously improve the accuracy of predictions. If the system determines the group of objects is not the final group in block 607, then operation returns to block 603 to measure current states and parameter values for the members of the group.

If the system determines the group of objects is the final group in block 607, the system generates a forecast for the group of objects (block 608). The system then calculates a new predicted envelope of trajectories based on the discovered sub-groups (block 609). Thereafter, operation ends (block 610).

Thus, the illustrative embodiments provide a mechanism for minimizing uncertainty envelopes in trajectories of evolving ensemble members, while periodically classifying and refining their trajectories. At periodic time steps, the mechanism groups the trajectories using clustering or similar classification techniques. The mechanism computes and monitors the subgroup envelopes and monitors/predicts the trajectories over a number of time steps. The mechanism also computes the uncertainty envelope of the union of the individual object envelopes, resulting in a much smaller overall envelope, which allows for better prediction and monitoring, particularly for critical parameters of the application involved.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising at least one processor and at least one memory, the at least one memory comprising instructions executed by the at least one processor to cause the at least one processor to implement a simulation system for minimizing uncertainty envelopes in trajectories of evolving ensemble members, the method comprising:
    receiving, by the simulation system from a user, a set of defining parameters for selecting member objects of an ensemble;
    identifying, by the simulation system, the ensemble of member objects satisfying the defining parameters;
    measuring initial states and parameter values for the ensemble of member objects based on an initial state-space;
    generating, by a predictor executing within the simulation system, a trajectory forecast of each member object of the ensemble based on the initial state-space, the initial states and parameter values, and a model for predicting trajectories of the member objects to generate a plurality of trajectory forecasts, wherein each of the plurality of trajectory forecasts has an individual uncertainty envelope and wherein the ensemble has an ensemble uncertainty envelope;
    applying, by a clustering system executing within the simulation system, a classification algorithm on the plurality of trajectory forecasts to identify at least one group of member objects having similar trajectory forecasts;
    generating, by an envelope calculator executing within the simulation system, a reduced ensemble of member objects including the identified group of member objects;
    performing at least one targeted correction to the reduced ensemble of member objects that is expected to cause the reduced ensemble to behave similarly;
    reconfiguring, by the simulation system, the state-space and the model for predicting trajectories for the reduced ensemble of member objects based on the at least one targeted correction;
    measuring updated states and parameter values for the reduced ensemble based on the reconfigured state-space; and
    generating, by the predictor executing within the simulation system, an updated trajectory forecast of each member object of the reduced ensemble based on the reconfigured state-space, the updated states and parameter values, and the reconfigured model for predicting trajectories of the member objects.

2. The method of claim 1, wherein each ensemble member has measurable properties that serve as state variables to define its location in the state-space at any given time and intrinsic parameters that determine changes in location from one time to another in the state-space and wherein the model predicts the future location of each ensemble member given its current measurable properties and its intrinsic parameters.

3. The method of claim 1, further comprising:
    calculating a predicted uncertainty envelope of trajectories of the reduced ensemble.

4. The method of claim 3, wherein calculating the predicted uncertainty envelope of trajectories comprises applying a minimax estimate function to the reduced ensemble.

5. The method of claim 1, wherein applying the classification algorithm on the plurality of trajectory forecasts comprises identifying a plurality of sub-groups of member objects having similar trajectory forecasts.

6. The method of claim 5, further comprising applying a minimax estimate function to each sub-group of member objects to predict a respective uncertainty envelope of trajectories.

7. The method of claim 1, wherein the classification algorithm comprises a k-means clustering algorithm.

8. The method of claim 1, wherein each member object within the ensemble of member objects comprises a device being manufactured using a staged process starting from initial components and leading to a final product, wherein the initial state-space comprises a set of test measurements during assembly, and wherein the at least one targeted correction comprises an adjustment to at least one component.

9. A computer program product comprising a computer readable storage medium having a computer readable program stored therein, wherein the computer readable program, when executed on a computing device, causes the computing device to implement a simulation system for minimizing uncertainty envelopes in trajectories of evolving ensemble members, the computer readable program causing the computing device to:
    receive, by the simulation system from a user, a set of defining parameters for selecting member objects of an ensemble;
    identify, by the simulation system, the ensemble of member objects satisfying the defining parameters;
    measure initial states and parameter values for the ensemble of member objects based on an initial state-space;
    generate, by a predictor executing within the simulation system, a trajectory forecast of each member object of the ensemble based on the initial state-space, the initial states and parameter values, and a model for predicting trajectories of the member objects to generate a plurality of trajectory forecasts, wherein each of the plurality of trajectory forecasts has an individual uncertainty envelope and wherein the ensemble has an ensemble uncertainty envelope;
    apply, by a clustering system executing within the simulation system, a classification algorithm on the plurality of trajectory forecasts to identify at least one group of member objects having similar trajectory forecasts;

generate, by an envelope calculator executing within the simulation system, a reduced ensemble of member objects including the identified group of member objects;

perform at least one targeted correction on the reduced ensemble of member objects that is expected to cause the reduced ensemble to behave similarly;

reconfigure, by the simulation system, the state-space and the model for predicting trajectories for the reduced ensemble of member objects based on at least one targeted correction performed on the reduced ensemble of member objects;

measure updated states and parameter values for the reduced ensemble based on the reconfigured state-space; and generate, by the predictor executing within the simulation system, an updated trajectory forecast of each member object of the reduced ensemble based on the reconfigured state-space, the updated states and parameter values, and the reconfigured model for predicting trajectories of the member objects.

10. The computer program product of claim 9, wherein the computer readable program further causes the computing device to:

calculate a predicted uncertainty envelope of trajectories of the reduced ensemble.

11. The computer program product of claim 10, wherein calculating the predicted uncertainty envelope of trajectories comprises applying a minimax estimate function to the reduced ensemble.

12. The computer program product of claim 9, wherein the classification algorithm comprises a k-means clustering algorithm.

13. The computer program product of claim 9, wherein each ensemble member has measurable properties that serve as state variables to define its location in the state-space at any given time and intrinsic parameters that determine changes in location from one time to another in the state-space and wherein the model predicts the future location of each ensemble member given its current measurable properties and its intrinsic parameters.

14. The computer program product of claim 9, wherein each member object within the ensemble of member objects comprises a device being manufactured using a staged process starting from initial components and leading to a final product, wherein the initial state-space comprises a set of test measurements during assembly, and wherein the at least one targeted correction comprises an adjustment to at least one component.

15. An apparatus comprising:

at least one processor; and a memory coupled to the at least one processor, wherein the memory comprises instructions which, when executed by the at least one processor, cause the at least one processor to implement a simulation system for minimizing uncertainty envelopes in trajectories of evolving ensemble members, the instructions causing the at least one processor to:

receive, by the simulation system from a user, a set of defining parameters for selecting member objects of an ensemble;

identify, by the simulation system, the ensemble of member objects satisfying the defining parameters;

measure initial states and parameter values for the ensemble of member objects based on an initial state-space;

generate, by a predictor executing within the simulation system, a trajectory forecast of each member object of an ensemble based on initial state-space, the initial states and parameter values, and a model for predicting trajectories of the member objects to generate a plurality of trajectory forecasts, wherein each of the plurality of trajectory forecasts has an individual uncertainty envelope and wherein the ensemble has an ensemble uncertainty envelope;

apply, by a clustering system executing within the simulation system, a classification algorithm on the plurality of trajectory forecasts to identify at least one group of member objects having similar trajectory forecasts;

generate, by an envelope calculator executing within the simulation system, a reduced ensemble of member objects including the identified group of member objects;

perform at least one targeted correction on the reduced ensemble of member objects that is expected to cause the reduced ensemble to behave similarly;

reconfigure, by the simulation system, the state-space and the model for predicting trajectories for the reduced ensemble of member objects based on at least one targeted correction performed on the reduced ensemble of member objects;

measuring updated states and parameter values for the reduced ensemble based on the reconfigured state-space; and generate, by the predictor executing within the simulation system, an updated trajectory forecast of each member object of the reduced ensemble based on the reconfigured state-space, the updated states and parameter values, and the reconfigured model for predicting trajectories of the member objects.

16. The apparatus of claim 15, wherein the instructions further cause the processor to:

calculate a predicted uncertainty envelope of trajectories of the reduced ensemble.

17. The apparatus of claim 16, wherein calculating the predicted uncertainty envelope of trajectories comprises applying a minimax estimate function to the reduced ensemble.

18. The apparatus of claim 15, wherein the classification algorithm comprises a k-means clustering algorithm.

19. The apparatus of claim 15, wherein each ensemble member has measurable properties that serve as state variables to define its location in the state-space at any given time and intrinsic parameters that determine changes in location from one time to another in the state-space and wherein the model predicts the future location of each ensemble member given its current measurable properties and its intrinsic parameters.

20. The apparatus of claim 15, wherein each member object within the ensemble of member objects comprises a device being manufactured using a staged process starting from initial components and leading to a final product, wherein the initial state-space comprises a set of test measurements during assembly, and wherein the at least one targeted correction comprises an adjustment to at least one component.

* * * * *